United States Patent
Imamura

(10) Patent No.: US 10,727,278 B2
(45) Date of Patent: Jul. 28, 2020

(54) METHOD OF MANUFACTURING SEMICONDUCTOR DEVICE AND SEMICONDUCTOR MANUFACTURING APPARATUS

(71) Applicant: TOSHIBA MEMORY CORPORATION, Minato-ku, Tokyo (JP)

(72) Inventor: Tsubasa Imamura, Kuwana Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/124,100

(22) Filed: Sep. 6, 2018

(65) Prior Publication Data
US 2019/0288035 A1    Sep. 19, 2019

(30) Foreign Application Priority Data
Mar. 19, 2018   (JP) ................... 2018-051506

(51) Int. Cl.
| H01L 21/66 | (2006.01) |
| H01L 27/24 | (2006.01) |
| H01L 45/00 | (2006.01) |
| H01L 29/786 | (2006.01) |
| H01L 29/49 | (2006.01) |

(52) U.S. Cl.
CPC ........ H01L 27/249 (2013.01); H01L 22/12 (2013.01); H01L 45/1226 (2013.01); H01L 45/1253 (2013.01); H01L 45/146 (2013.01); H01L 45/1633 (2013.01); H01L 45/1675 (2013.01); *H01L 27/2454* (2013.01); *H01L 29/4908* (2013.01); *H01L 29/78642* (2013.01)

(58) Field of Classification Search
CPC ............ H01L 27/249; H01L 45/1226; H01L 45/1675; H01L 22/12; H01L 45/1253; H01L 45/1633; H01L 45/146; H01L 27/2454; H01L 29/4908; H01L 29/78642
USPC ........................................................ 438/14
See application file for complete search history.

(56) References Cited

U.S. PATENT DOCUMENTS

| 6,660,647 B1 | 12/2003 | Ono et al. |
| 6,972,453 B2* | 12/2005 | Ohtake ............ H01L 21/31138 |
| | | 257/314 |

(Continued)

FOREIGN PATENT DOCUMENTS

| JP | H03-12921 | 1/1991 |
| JP | H11-340213 | 12/1999 |

(Continued)

OTHER PUBLICATIONS

Shinoda, et al., "Atomic Layer Etching of TiN Using Formation and Desorption of Modified Layer," 77th Annual Meeting of the Japan Society of Applied Physics Lecture, 13a-B9-11, 07-022, 2 pages (including translation) (2016).

*Primary Examiner* — Vu A Vu
(74) *Attorney, Agent, or Firm* — Foley & Lardner LLP

(57) ABSTRACT

In one embodiment, a method of manufacturing a semiconductor device includes forming a first film on a first substrate. The method further includes performing a first process of processing a portion of the first film with plasma of first gas and a second process of removing the portion of the first film with plasma of second gas after the first process.

13 Claims, 9 Drawing Sheets

(56) References Cited

U.S. PATENT DOCUMENTS

| | | | |
|---|---|---|---|
| 7,902,076 B2 | 3/2011 | Imamura | |
| 8,895,449 B1 * | 11/2014 | Zhu | H01L 21/3105 216/58 |
| 2007/0238304 A1 * | 10/2007 | Wu | H01L 21/31116 438/710 |
| 2017/0018405 A1 | 1/2017 | Kobayashi et al. | |
| 2017/0125217 A1 * | 5/2017 | Dorf | H01J 37/3233 |
| 2017/0345671 A1 * | 11/2017 | Ranjan | H01L 21/0337 |

FOREIGN PATENT DOCUMENTS

| | | |
|---|---|---|
| JP | 3011018 B2 | 2/2000 |
| JP | 2000-133634 A | 5/2000 |
| JP | 4364011 B2 | 11/2009 |
| JP | 2010-16236 A | 1/2010 |
| JP | 2017-28001 A | 2/2017 |

* cited by examiner

US 10,727,278 B2

METHOD OF MANUFACTURING SEMICONDUCTOR DEVICE AND SEMICONDUCTOR MANUFACTURING APPARATUS

CROSS REFERENCE TO RELATED APPLICATION

This application is based upon and claims the benefit of priority from the prior Japanese Patent Application No. 2018-051506, filed on Mar. 19, 2018, the entire contents of which are incorporated herein by reference.

FIELD

Embodiments described herein relate to a method of manufacturing a semiconductor device and a semiconductor manufacturing apparatus.

BACKGROUND

After a film is formed on a substrate, there is a case where a portion of the film is desired to be removed to thin the film. For example, after a sidewall film is formed on a side face of a stacked body on the substrate, there is a case where a portion of the sidewall film is removed to reduce a thickness of the sidewall film. In this case, the problem is how such reduction of the thickness is implemented when the thickness is desired to be reduced by a small amount with high accuracy, for example.

DETAILED DESCRIPTION

Embodiments will now be explained with reference to the accompanying drawings.

In one embodiment, a method of manufacturing a semiconductor device includes forming a first film on a first substrate. The method further includes performing a first process of processing a portion of the first film with plasma of first gas and a second process of removing the portion of the first film with plasma of second gas after the first process.

First Embodiment

Figure 1:
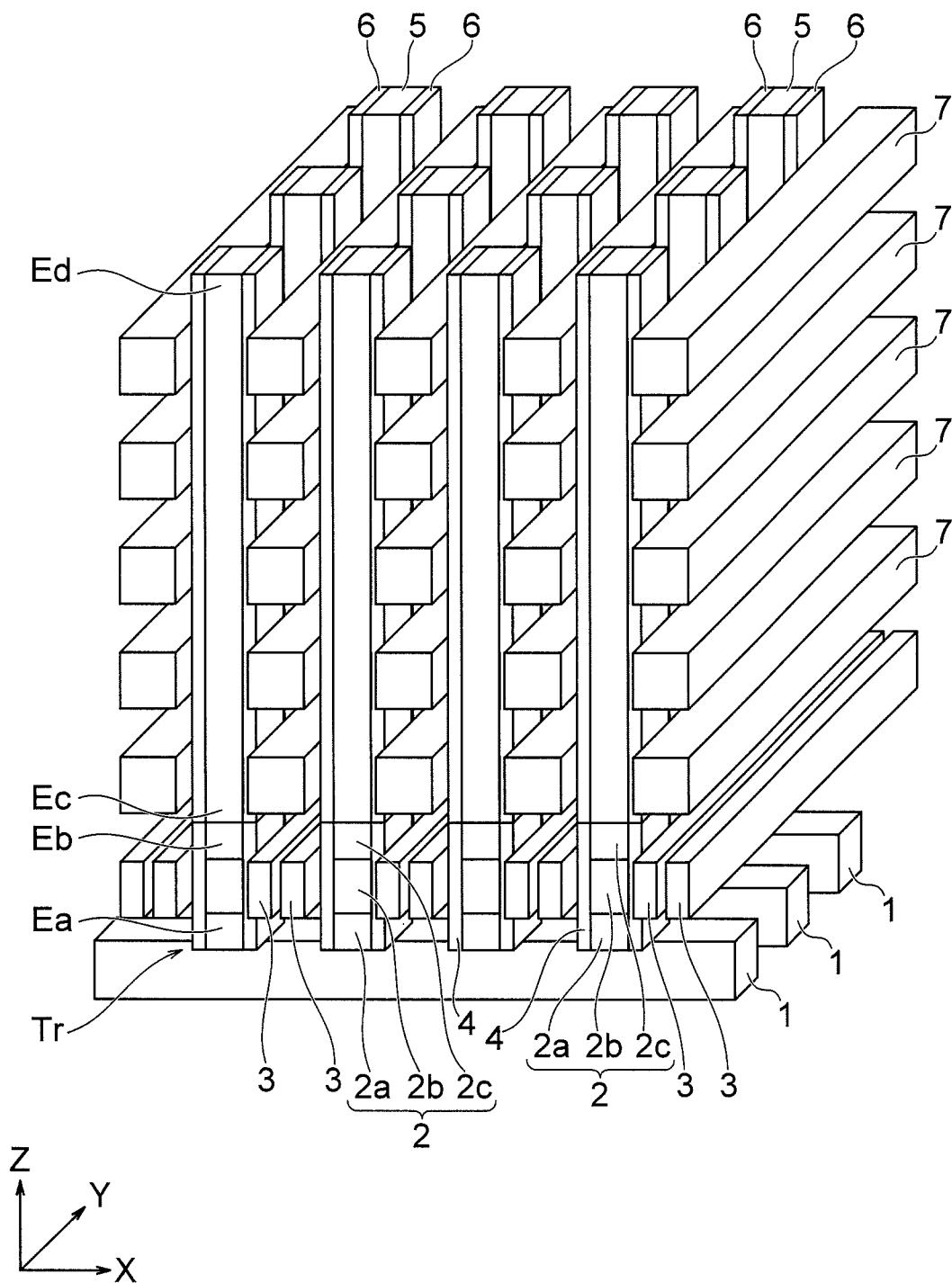
FIG. 1 is a perspective view illustrating a configuration of a semiconductor device of a first embodiment.

FIG. 1 is a perspective view illustrating a configuration of a semiconductor device of a first embodiment. The semiconductor device illustrated in FIG. 1 is an ReRAM (resistive random access memory).

The semiconductor device illustrated in FIG. 1 includes a plurality of global bit lines 1. The global bit lines 1 may be each formed of a portion of a silicon substrate or may be formed of a polysilicon layer provided on the silicon substrate with an insulator interposed therebetween, for example. In the former case, an isolation insulator is formed between the global bit lines 1.

FIG. 1 illustrates an X-direction and a Y-direction, which are parallel to a surface of the substrate and are perpendicular to each other, and a Z-direction perpendicular to the surface of the substrate. The global bit lines 1 extend in the X-direction and are adjacent to one another in the Y-direction. Although the +Z-direction is handled as an upward direction and the −Z-direction is handled as a downward direction in the specification, the −Z-direction may match or may not match a direction of gravity.

A plurality of semiconductor members 2 are formed on each of the global bit lines 1. The semiconductor members 2 are arranged in a matrix shape along the X-direction and the Y-direction. Reference characters Ea and Eb respectively represent a lower end and an upper end of each of the semiconductor members 2. The lower end Ea of each of the semiconductor members 2 is electrically connected to the one global bit line 1.

Each of the semiconductor members 2 includes an n-type portion 2a formed on the one global bit line 1, a p-type portion 2b formed on the n-type portion 2a, and an n-type portion 2c formed on the p-type portion 2b. The n-type portion 2a, the p-type portion 2b, and the n-type portion 2c are formed of a polysilicon layer, for example. In the present embodiment, the n-type portions 2a and 2c may be each replaced with a p-type portion, and the p-type portion 2b may be replaced with an n-type portion.

The semiconductor device illustrated in FIG. 1 further includes a plurality of gate electrodes 3 extending in the Y-direction among the semiconductor members 2. The gate electrode 3 is formed of a polysilicon layer, for example. Each of the gate electrodes 3 is provided on respective side faces in the +X-direction or respective side faces in the −X-direction of the top of the n-type portion 2a, the whole of the p-type portion 2b, and the bottom of the n-type portion 2c with a gate insulator 4 interposed therebetween.

The gate insulators 4 are each formed on a side face in the +X-direction and a side face in the −X-direction of each of the semiconductor members 2. The gate insulator 4 is a silicon oxide film, for example. The one semiconductor member 2, a pair of the gate electrodes 3, and the gate insulators 4 between the one semiconductor member 2 and the pair of gate electrodes 3 constitute an n-channel TFT (thin film transistor), as indicated by reference character Tr. The TFT is a switching element which switches conduction and interruption of a current.

One local bit line 5 having a pillar shape extending in the Z-direction is formed on each of the semiconductor members 2. The local bit line 5 is formed of a titanium nitride film (TiN), for example. Reference characters Ec and Ed respectively represent a lower end and an upper end of each of the local bit lines 5. The lower end Ec of each of the local bit lines 5 is electrically connected to the upper end Eb of the one semiconductor member 2.

Resistance change films 6 are respectively formed on a side face in the +X-direction and a side face in the −X-direction of each of the local bit lines 5. The resistance change film 6 is a film which changes in resistance state depending on a supplied voltage or current. Details of a material for and a shape of the resistance change film 6 will be described below.

The semiconductor device illustrated in FIG. 1 further includes a plurality of word lines 7 extending in the Y-direction between the local bit lines 5. The plurality of word lines 7 adjacent to one another in the Z-direction are arranged between the local bit lines 5 adjacent to each other in the X-direction. The word line 7 is formed of a titanium nitride film, for example. The resistance change film 6 is formed between the local bit line 5 and the word line 7.

Figure 2:
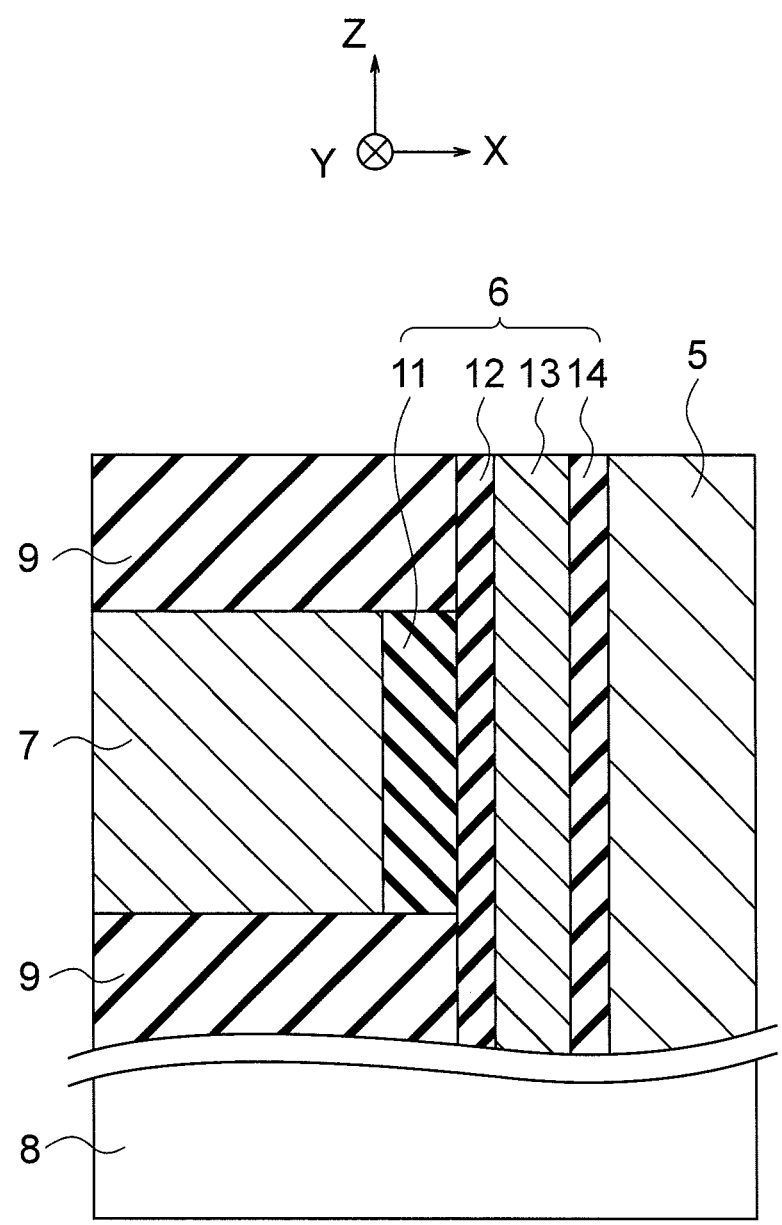
FIG. 2 is a cross-sectional view illustrating the configuration of the semiconductor device of the first embodiment.

FIG. 2 is a cross-sectional view illustrating the configuration of the semiconductor device of the first embodiment.

FIG. 2 illustrates a substrate 8, some of a plurality of inter layer dielectrics 9 and a plurality of word lines 7 alternately stacked above the substrate 8, and a local bit line 5 arranged on respective side faces of the inter layer dielectrics 9 and the word lines 7 with the resistance change film 6 interposed therebetween. FIG. 2 illustrates two of the plurality of inter layer dielectrics 9 and one of the plurality of word lines 7 as an example. FIG. 2 illustrates a cross section of one memory cell (ReRAM cell) formed at an intersection of the one local bit line 5 and the one word line 7.

The substrate 8 is a semiconductor substrate such as a silicon substrate, for example. The inter layer dielectric 9 is a silicon oxide film ($SiO_2$), for example. The word line 7 is a titanium nitride film, for example. The resistance change film 6 includes a switching layer 11, a first barrier layer 12, a second barrier layer 13, and a third barrier layer 14 which are provided in this order between the word line 7 and the local bit line 5. The substrate 8, the switching layer 11, the inter layer dielectric 9, and the word line 7 are respectively examples of a first substrate, a first film, a second film, and a third film.

The switching layer 11, together with the word line 7, is formed between the inter layer dielectrics 9. The switching layer 11 in the present embodiment is formed of a material having a relatively high conductivity and having a relatively narrow bandgap. The switching layer 11 is a metal oxide film such as a titanium oxide film ($TiO_x$), for example. The switching layer 11 in the present embodiment is divided for each of the word lines 7.

The first to third barrier layers 12 to 14 are formed in this order on the respective side faces of the inter layer dielectrics 9 and the word line 7 with the switching layer 11 interposed therebetween. The first and third barrier layers 12 and 14 in the present embodiment are formed of a material having a lower conductivity and having a wider bandgap than those of a material for the switching layer 11. The first barrier layer 12 is a metal oxide film such as an aluminum oxide film ($AlO_x$). The second barrier layer 13 is a semiconductor layer such as an amorphous silicon layer (a-Si). The third barrier layer 14 is a non-metal oxide film such as a silicon oxide film ($SiO_2$). The first to third barrier layers 12 to 14 in the present embodiment are not divided for each of the word lines 7.

When a voltage is applied to the resistance change film 6, oxygen ions are respectively introduced into the switching layer 11 from the first to third barrier layers 12 to 14. As a result, a band structure of the resistance change film 6 changes so that a resistance state of the resistance change film 6 changes. An area where the resistance state mainly changes is presumed to be positioned in the vicinity of the first barrier layer 12 in the switching layer 11.

Figure 3:
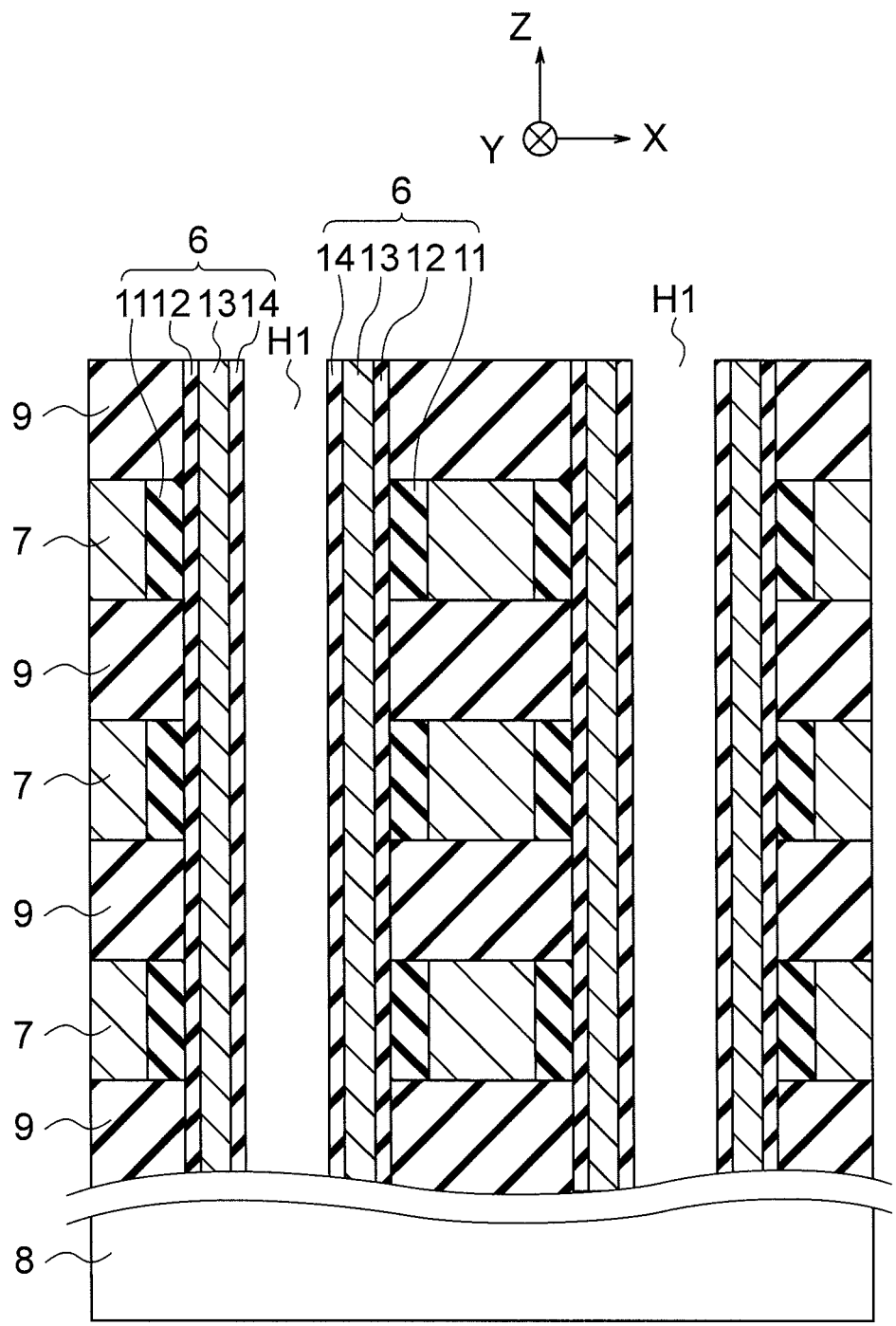
FIG. 3 is another cross-sectional view illustrating the configuration of the semiconductor device of the first embodiment.

FIG. 3 is another cross-sectional view illustrating the configuration of the semiconductor device of the first embodiment.

FIG. 3 illustrates the same cross section as that illustrated in FIG. 2 in a wider range. FIG. 3 illustrates the semiconductor device before completion in which a plurality of holes H1 remain for convenience of illustration. The local bit lines 5 are formed in each of the holes H1.

FIG. 3 illustrates a plurality of (here, three) stacked bodies each alternately including a plurality of inter layer dielectrics 9 and a plurality of word lines 7. In the present embodiment, the plurality of holes H1 are formed among the stacked bodies adjacent to one another, and the holes H1 are separated from each other by a plurality of insulators (not illustrated). The resistance change film 6 is formed on a side face in the +X-direction and a side face in the −X-direction of the stacked body and a side face in the +Y-direction and a side face in the −Y-direction of the insulator in each of the holes H1, and has an annular planar shape.

When the resistance change film 6 becomes thick, the hole H1 becomes small, so that the local bit line 5 is not easily formed in the hole H1. However, the switching layer 11 in the present embodiment, together with the word line 7, is formed between the inter layer dielectrics 9. Therefore, the size of the hole H1 in a case where the local bit lines 5 are formed therein depends on the first to third barrier layers 12 to 14, and does not substantially depend on the switching layer 11. Accordingly, the local bit lines 5 are easily formed in the hole H1. Since the switching layer 11 is divided for each of the word lines 7, a leak current between the word lines 7 caused by the switching layer 11 can be suppressed.

However, the problem is how the switching layer 11 having such a shape is to be formed. An example of such a method will be described below.

FIGS. 4A to 6C are cross-sectional views illustrating a method of manufacturing the semiconductor device of the first embodiment. In the following description, the word line 7 is also written as a "line material layer 7".

Figure 4A:
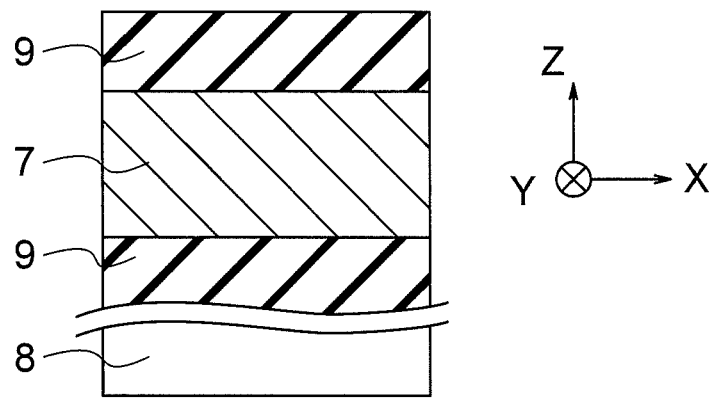
FIGS. 4A to 6C are cross-sectional views illustrating a method of manufacturing the semiconductor device of the first embodiment.
Figure 4B:
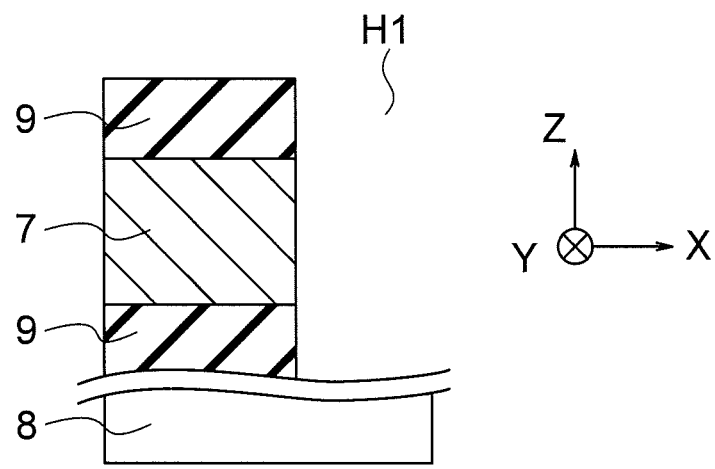

First, a plurality of inter layer dielectrics 9 and a plurality of line material layers 7 are alternately formed on a substrate 8 (FIG. 4A). Then, a hole H1, which penetrates the inter layer dielectrics 9 and the line material layers 7, is formed by lithography and etching (FIG. 4B). The hole H1 is the same as the hole H1 illustrated in FIG. 3. The hole H1 is an example of a first concave portion.

Figure 4C:
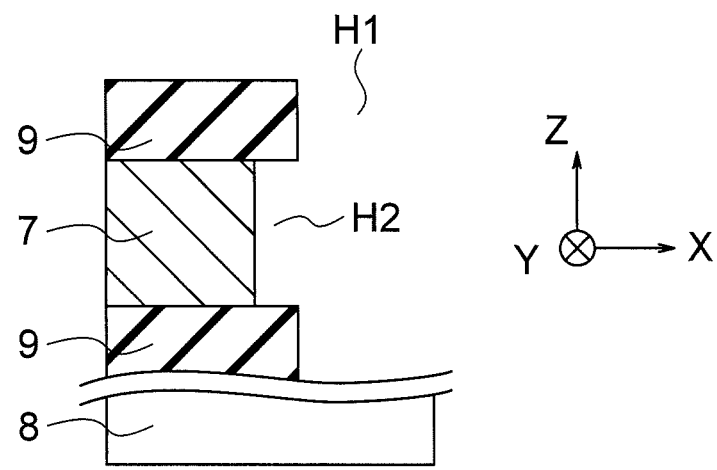
Figure 5A:
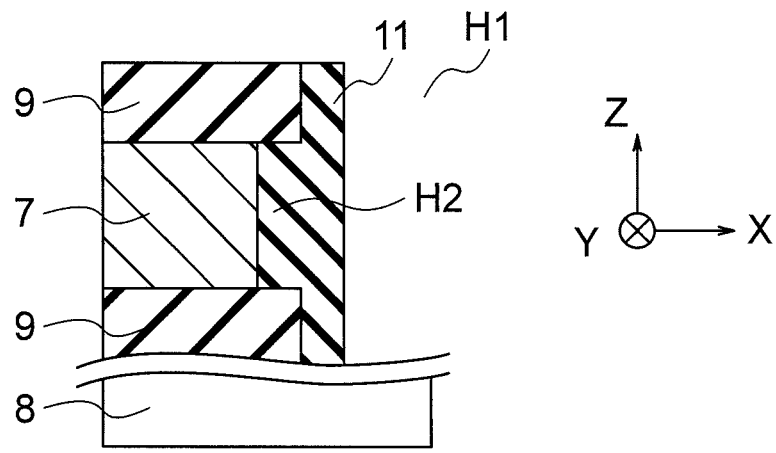

Then, a depressed portion H2 is formed on a side face of each of the line material layers 7 in the hole H1 by selective etching (FIG. 4C). The depressed portion H2 is an example of a second concave portion. Then, a switching layer 11 is formed on respective side faces of the inter layer dielectrics 9 and a side face of each line material layer 7 in the hole H1 (FIG. 5A). Accordingly, the switching layer 11 is formed inside the depressed portions H2 and outside the depressed portions H2.

Then, a plurality of first processes of processing a portion of the switching layer 11 with plasma of first gas and a plurality of second processes of removing the portion of the switching layer 11 with plasma of second gas are alternately performed. Accordingly, a thickness of the switching layer 11 is reduced. More specifically, the switching layer 11 outside the depressed portions H2 is removed.

Figure 5B:
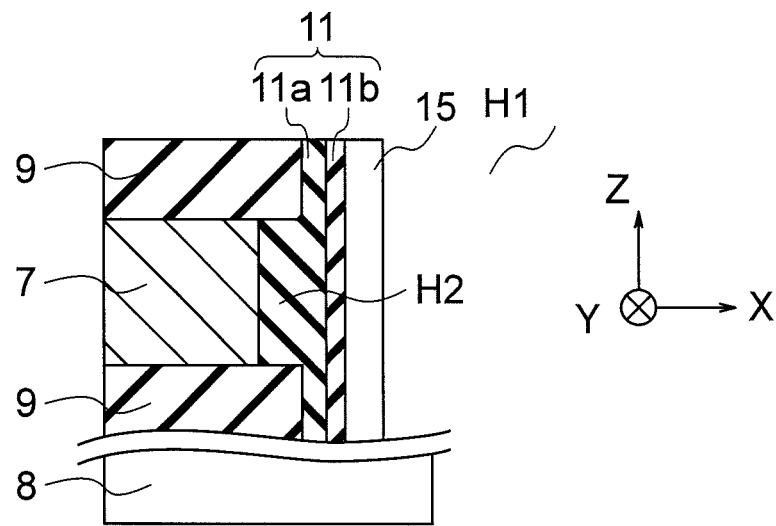
Figure 5C:
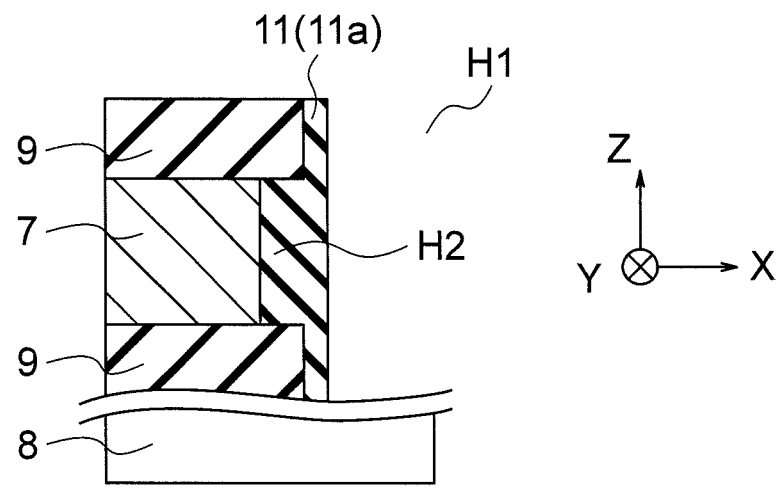
Figure 6A:
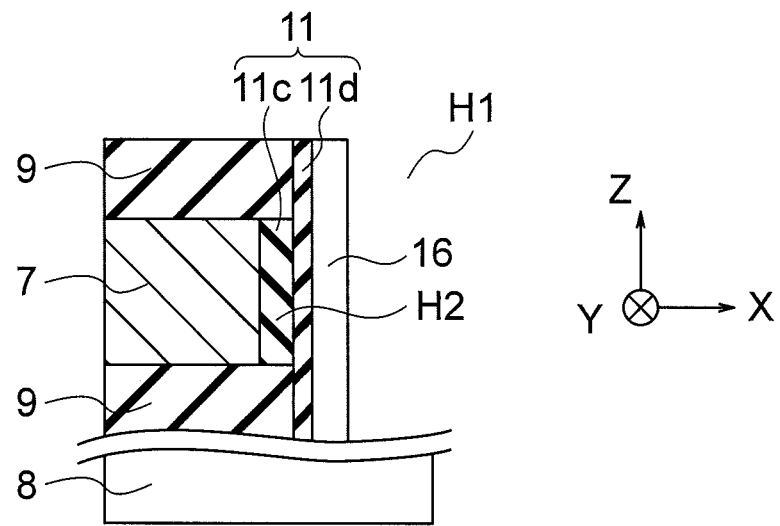
Figure 6B:
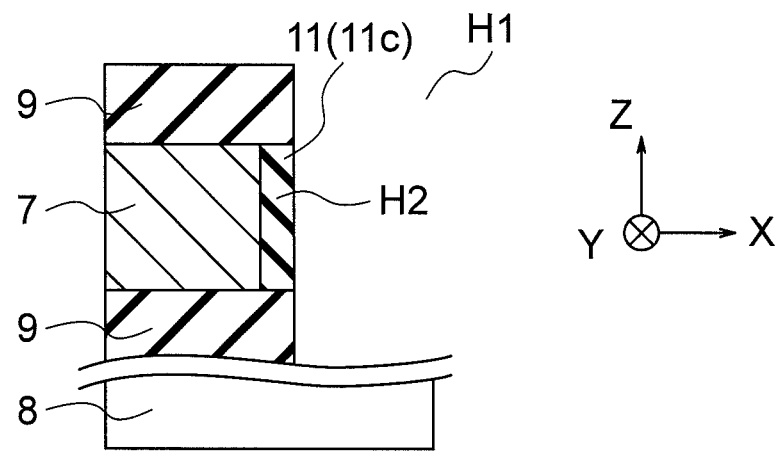

Steps illustrated in FIG. 5B and FIG. 6A correspond to the first processes, and steps illustrated in FIG. 5C and FIG. 6B corresponds to the second processes. Although the first processes and the second processes are each performed twice in the present embodiment, the first processes and the second processes may be each performed three or more times, or may be each performed only once. The number of repetitions of the first and second processes is hereinafter referred to as a "number of cycles".

In the first processes in the present embodiment, the portion of the switching layer 11 is altered with the plasma of the first gas. In the second processes in the present embodiment, the portion of the switching layer 11 is ashed with the plasma of the second gas. The first processes and the second processes are performed in the same plasma processing chamber. Details of the first processes and the second processes will be described below.

In the first process illustrated in FIG. 5B, the first gas is supplied to the chamber that contains the substrate 8, to heat the substrate 8. The first gas in the present embodiment is $C_Y H_A F_Z$ gas. Y is an integer equal to or more than 1, A is an integer equal to or more than 0, Z is an integer equal to or more than 1, a relationship of $Z \leq 2Y$ is satisfied, C represents carbon, H represents hydrogen, and F represents fluorine. The first gas may include two or more types of $C_Y H_A F_Z$ gas, or may include $C_Y H_A F_Z$ gas and other gases. In the step, $C_4 F_8$ gas is used as the first gas.

Then, if a temperature of the substrate 8 reaches a predetermined temperature (e.g., 60° C.) and pressure in the chamber reaches predetermined pressure (e.g., 10 mT), high-frequency power is applied between an upper electrode and a lower electrode in the chamber. As a result, the plasma of the first gas is generated between the upper electrode and the lower electrode.

When the plasma of the first gas is generated in the chamber, an organic film 15 containing carbon and fluorine is formed on a side face of the switching layer 11 with the plasma (FIG. 5B). A portion of the switching layer 11 is altered, so that an alteration layer (reaction layer) 11b is formed in the switching layer 11. The alteration layer 11b is formed in an interface between the switching layer 11 and the organic film 15. A remaining portion of the switching layer 11 is not altered but remains as a non-alteration layer (non-reaction layer) 11a. In the present embodiment, high-frequency power continues to be applied until the alteration layer 11b has a desired thickness, and the high-frequency power then stops being applied. As a result, plasma discharge ends, and the first process illustrated in FIG. 5B ends.

In the second process illustrated in FIG. 5C, the second gas is supplied to the chamber that contains the substrate 8.

The second gas in the present embodiment is $O_2$ gas, CO gas, $CO_2$ gas, COS gas, $H_2O$ gas, $H_2$ gas, $N_2O$ gas, or $N_2$ gas. O represents oxygen, C represents carbon, S represents sulfur, H represents hydrogen, and N represents nitrogen. The second gas may include only one type of the gases, or may include two or more types of the gases. In the step, $O_2$ gas is used as the second gas.

Then, if the pressure in the chamber reaches predetermined pressure (e.g., 100 mT), high-frequency power is applied between the upper electrode and the lower electrode in the chamber. As a result, the plasma of the second gas is generated between the upper electrode and the lower electrode.

When the plasma of the second gas is generated in the chamber, the organic film 15 and the alteration layer 11b are ashed and removed with the plasma (FIG. 5C). In the present embodiment, the high-frequency power continues to be applied until the organic film 15 and the alteration layer 11b are completely removed, and the high-frequency power then stops being applied. As a result, plasma discharge ends, and the second process illustrated in FIG. 5C ends.

The first process illustrated in FIG. 6A is performed similarly to the first process illustrated in FIG. 5B. As a result, an organic film 16 containing carbon and fluorine is formed on the side face of the switching layer 11. A portion of the switching layer 11 is altered, so that an alteration layer 11d is formed in the switching layer 11. A remaining portion of the switching layer 11 is not altered but remains as a non-alteration layer 11c. In the present embodiment, high-frequency power continues to be applied until the alteration layer 11d has a desired thickness, and the high-frequency power then stops being applied. As a result, plasma discharge ends, and the first process illustrated in FIG. 6A ends.

The second process illustrated in FIG. 6B is performed similarly to the second process illustrated in FIG. 5C. As a result, the organic film 16 and the alteration layer 11d are ashed and removed. In the present embodiment, high-frequency power continues to be applied until the organic film 16 and the alteration layer 11d are completely removed, and the high-frequency power then stops being applied. As a result, plasma discharge ends, and the second process illustrated in FIG. 6B ends.

The first processes and the second processes in the present embodiment are repeated until the switching layer 11 outside the depressed portions H2 is completely removed. Since the switching layer 11 outside the depressed portions H2 is completely removed in FIG. 6B, repetition of the first processes and the second processes ends in the step illustrated in FIG. 6B. According to the first processes and the second processes in the present embodiment, the switching layer 11 is divided for each line material layer (word line) 7.

Figure 6C:
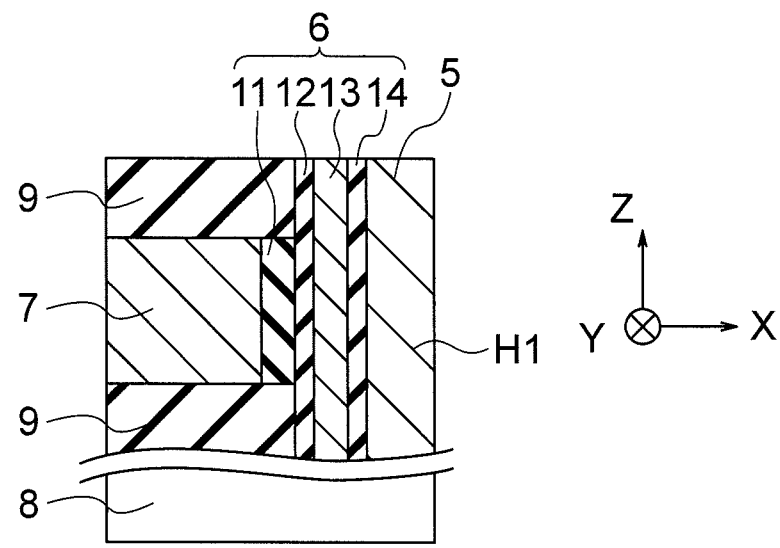

Then, first to third barrier layers 12 to 14 are sequentially formed on respective side faces of the inter layer dielectrics 9 and the word lines 7 with the switching layer 11 interposed therebetween in the hole H1 (FIG. 6C). Then, a local bit line 5 is formed in the hole H1 (FIG. 6C). In this manner, the semiconductor device of the present embodiment is manufactured.

According to the present embodiment, the thickness of the switching layer 11 can be reduced by a small amount with high accuracy by performing the first process once and performing the second process once. For example, if the switching layer 11 is removed by conventional dry etching, an etching amount of the switching layer 11 changes depending on the depth of an etching point in the hole H1, so that the etching amount becomes difficult to control. On the other hand, according to the present embodiment, when the switching layer 11 is removed using alteration and ashing of the switching layer 11, depth dependency of a removal amount of the switching layer 11 can be suppressed. For example, a thickness on the order of 1 nm can be reduced by performing the first process once and performing the second process once.

In this manner, according to the present embodiment, the thickness of the switching layer 11 can be favorably adjusted. Accordingly, as illustrated in FIG. 6B, control for leaving the switching layer 11 inside the depressed portions H2 and removing the switching layer 11 outside the depressed portions H2 can also be implemented. In this case, a remaining amount and a removal amount of the switching layer 11 can be inhibited from varying depending on the depth in the hole H1.

The first processes and the second processes in the present embodiment are also applicable to a layer other than the switching layer 11 ($TiO_x$). For example, the first processes and the second processes are applicable to a conductive layer, a semiconductor layer, an insulating layer, and the like each containing at least one of W (tungsten), Al (aluminum), Ti (titanium), Ta (tantalum), Fe (iron), Pt (platinum), Mg (magnesium), Si (silicon), Mo (molybdenum), Co (cobalt), La (lanthanum), Hf (hafnium), Ir (iridium), Ru (ruthenium), Zr (zirconium), and Re (rhenium). More specifically, the first processes and the second processes may be applied to a single metal film, a metal oxide film, or a metal nitride film containing at least one of the elements. Although the first processes and the second processes have been performed to leave the switching layer 11 in the depressed portions H2 in the present embodiment, the first processes and the second processes are also applicable to other purposes.

Ion energy of each of the plasma of the first gas and the plasma of the second gas in the present embodiment are each desirably set to less than 100 eV. A temperature of the substrate 8 in the first processes and the second processes in the present embodiment is desirably set to 10° C. or more (e.g., 40° C. or more). Details of this condition will be described below.

Figure 7:
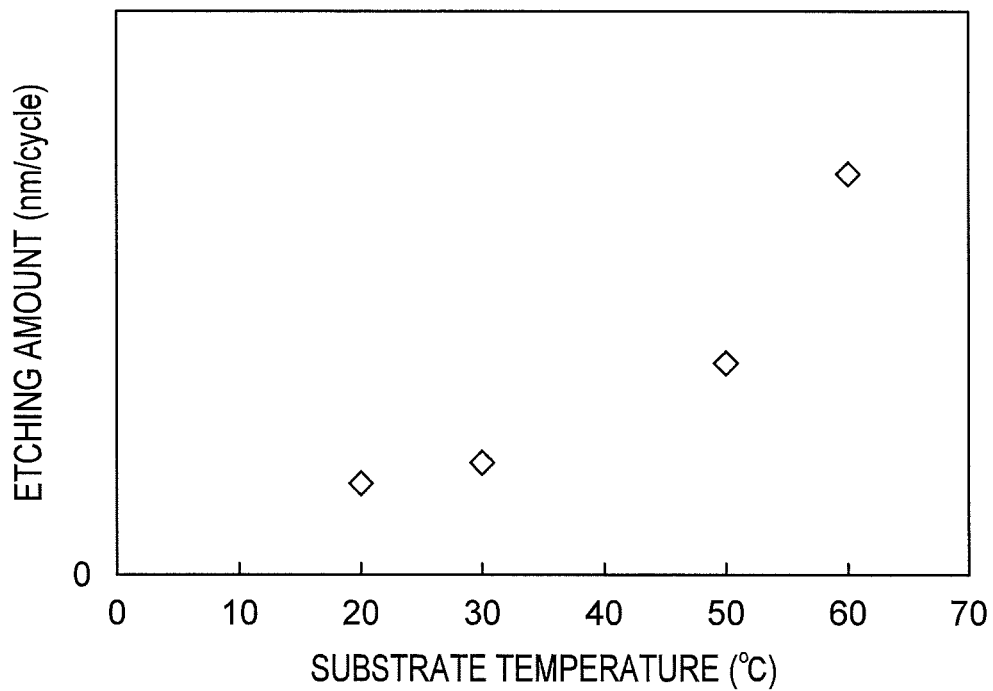
FIG. 7 is a graph for describing an advantage of the method of manufacturing the semiconductor device of the first embodiment.

FIG. 7 is a graph for describing an advantage of a method of manufacturing the semiconductor device of the first embodiment. A horizontal axis represents a temperature of the substrate 8 in the first processes and the second processes, and more specifically represents a temperature of the lower electrode in the above-described chamber. A vertical axis represents an etching amount (ashing amount) of the switching layer 11 per cycle.

FIG. 7 shows that the switching layer 11 can be etched at approximately 10° C. or more. Accordingly, in the present embodiment, the temperature of the substrate 8 in the first processes and the second processes may be set to approximately 10° C. or more.

FIG. 7 shows that an etching amount of the switching layer 11 greatly increases at approximately 40° C. Accordingly, in the present embodiment, the temperature of the substrate 8 in the first processes and the second processes is desirably set to 40° C. or more.

Figure 8:
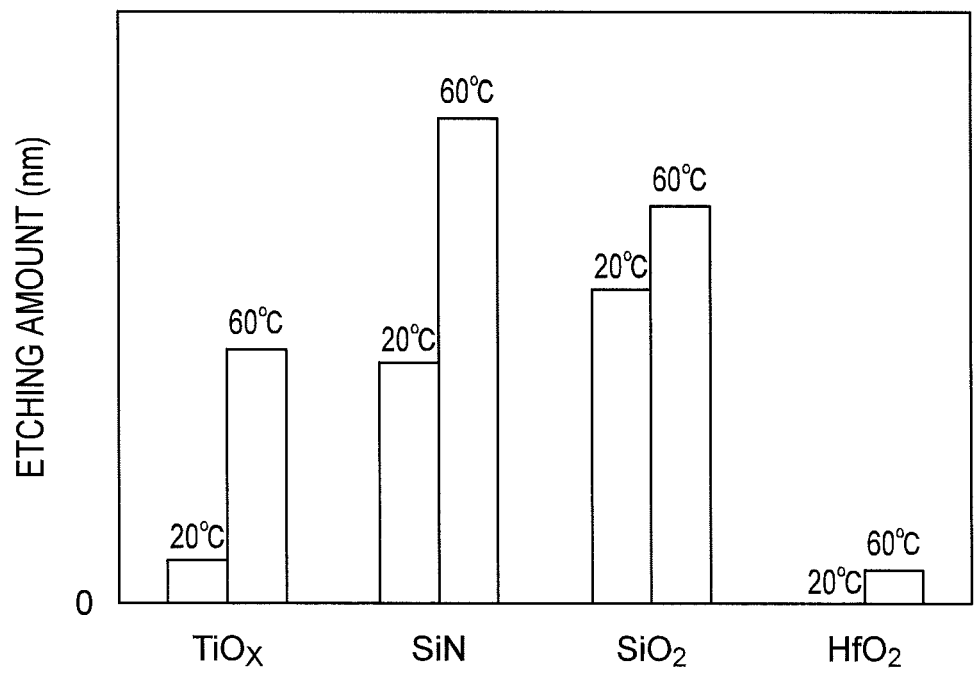
FIG. 8 is another graph for describing an advantage of the method of manufacturing the semiconductor device of the first embodiment.

FIG. 8 is another graph for describing an advantage of the method of manufacturing the semiconductor device of the first embodiment. FIG. 8 illustrates an etching amount of a film corresponding to six cycles when a film to which the first processes and the second processes are to be applied is a $TiO_X$ film, an SiN film, an $SiO_2$ film, and an $HfO_2$ film. Temperatures (20° C. and 60° C.) illustrated in FIG. 8 each represent a temperature of the substrate 8 in the first processes and the second processes.

FIG. 8 shows that a metal-based film is more easily etched than a silicon-based film and ease of etching greatly differs depending on a material for the film. Although the film, which is easily etched, is easy to process, its thickness may be difficult to control. On the other hand, the film, which is not easily etched, may be difficult to process, although its thickness is easy to control. However, the properties are adjustable by changing the temperature of the substrate 8.

Figure 9:
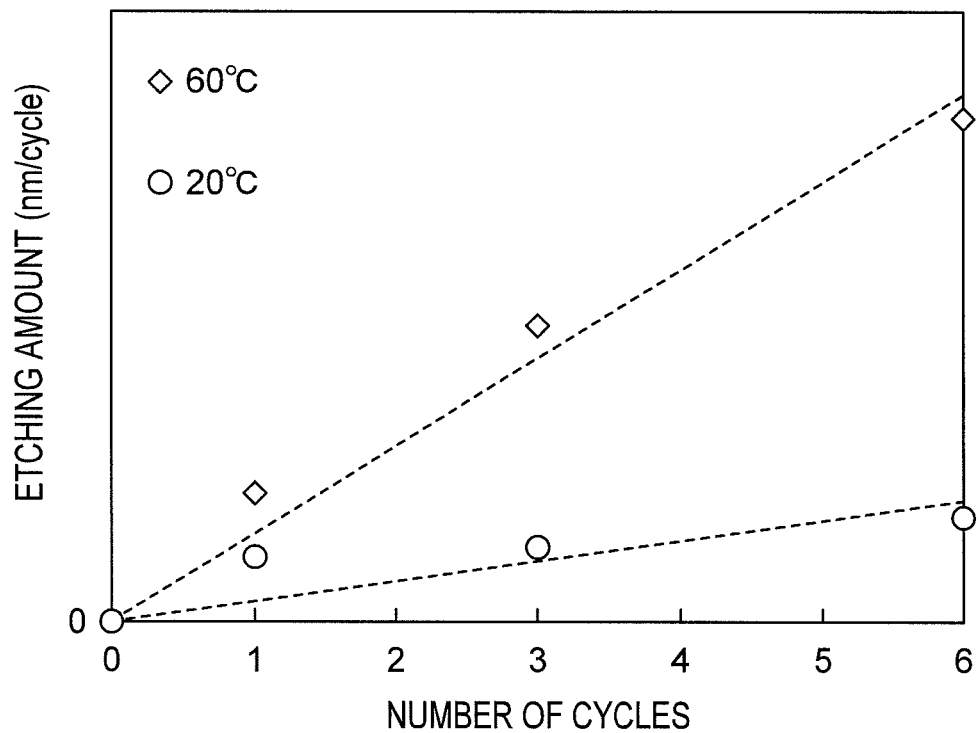
FIG. 9 is another graph for describing an advantage of the method of manufacturing the semiconductor device of the first embodiment.

FIG. 9 is another graph for describing an advantage of the method of manufacturing the semiconductor device of the first embodiment. A horizontal axis represents a number of cycles of the first and second processes. A vertical axis represents an etching amount of the switching layer 11. Temperatures (20° C. and 60° C.) illustrated in FIG. 9 each represent a temperature of the substrate 8 in the first processes and the second processes.

FIG. 9 shows that the etching amount of the switching layer 11 can be controlled if the temperature of the substrate 8 is changed. More specifically, the higher the temperature of the substrate 8 is, the larger the etching amount becomes.

Figure 10:
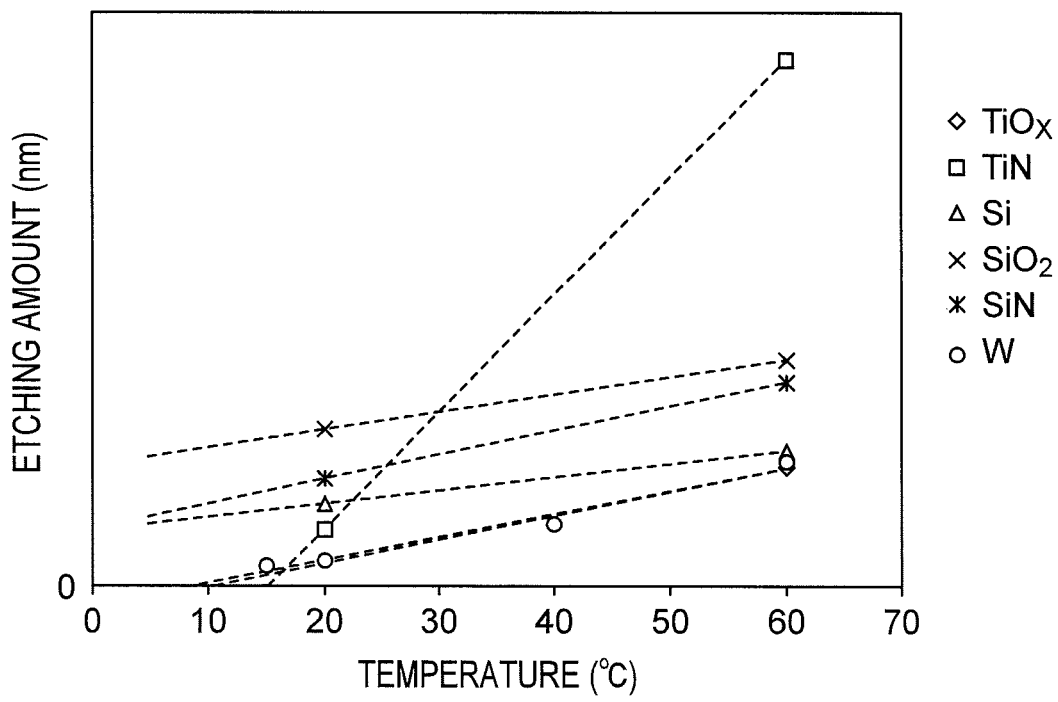
FIG. 10 is another graph for describing an advantage of the method of manufacturing the semiconductor device of the first embodiment.

FIG. 10 is another graph for describing an advantage of the method of manufacturing the semiconductor device of the first embodiment. FIG. 10 illustrates, when a film to which the first processes and the second processes are to be applied is a $TiO_X$ film, a TiN film, an Si film, an $SiO_2$ film, an SiN film, and W film, a relationship between a temperature and an etching amount of each of the films.

FIG. 10 shows that any one of the metal films (the $TiO_X$ film, the TiN film, and the W film) is not etched when its temperature is less than 10° C. If the first processes and the second processes are applied to the metal film, the temperature of the metal film may be set to 10° C. or more by setting the temperature of the substrate 8 in the first processes and the second processes to 10° C. or more.

As described above, in the present embodiment, when the plurality of first processes of processing a portion of the switching layer 11 with the plasma of the first gas and the plurality of second processes of removing the portion of the switching layer 11 with the plasma of the second gas are alternately performed, the thickness of the switching layer 11 is reduced. Accordingly, according to the present embodiment, the thickness of the switching layer 11 can be favorably adjusted.

The method of the present embodiment is also applicable to a semiconductor device other than the ReRAM, and may be applied to a semiconductor memory having a cross-point structure, for example. The method of the present embodiment can also be applicable to a flat side face having no depressed portions H2 to control its thickness to a desired thickness. The present embodiment may be adopted to the case where the first and second processes are each performed only once.

Second Embodiment

Figure 11:
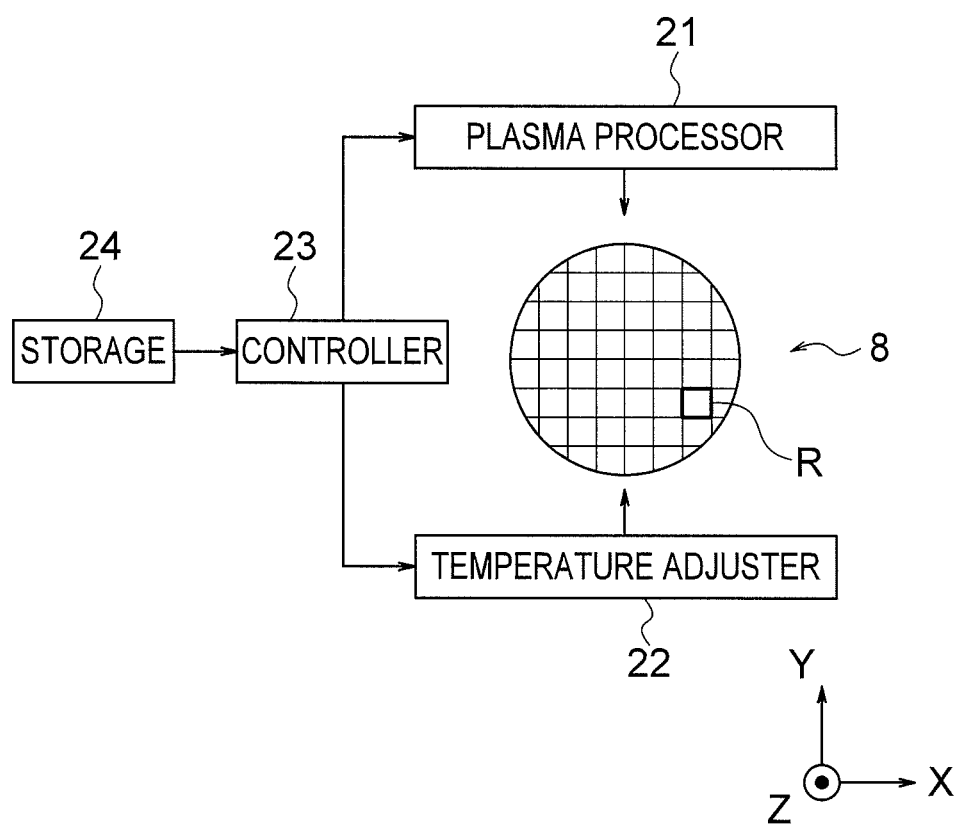
FIG. 11 is a block diagram illustrating a configuration of a semiconductor manufacturing apparatus of a second embodiment.

FIG. 11 is a block diagram illustrating a configuration of a semiconductor manufacturing apparatus of a second embodiment.

The semiconductor manufacturing apparatus illustrated in FIG. 11 is a plasma processing apparatus for performing first processes and second processes, and includes a plasma processor 21, a temperature adjuster 22, a controller 23, and a storage 24. The controller 23 is an example of first and second controllers.

The plasma processor 21 includes a plasma processing chamber that contains a substrate 8, a gas supply device that supplies first gas and second gas in the chamber, upper and lower electrodes that generate plasma by applying high-frequency power to the gas in the chamber. Accordingly, a switching layer 11 on the substrate 8 can be processed with the plasma.

The temperature adjuster 22 adjusts temperatures of plural sites of the substrate 8 for each site. FIG. 8 illustrates how a surface of the substrate 8 is divided in a grid shape including a plurality of squares R by a plurality of straight lines extending in an X-direction and a plurality of straight lines extending in a Y-direction. The temperature adjuster 22 in the present embodiment can adjust a temperature of the substrate 8 for each area corresponding to the square R. For example, the temperature adjuster 22 can heat only the predetermined site of the substrate 8 and adjust the temperature of the site to 10° C. or more. Although the surface of the substrate 8 has been divided in the grid shape including the plurality of squares R to adjust the temperature for each site in the present embodiment, the surface may be divided in another shape.

The storage 24 is used to previously store positions of a first site to be adjusted to a first temperature and a second site to be adjusted to a second temperature lower than the first temperature. When the first processes and the second processes of the substrate 8 are performed, data of the positions are read out of the storage 24, and the temperature of the first site of the substrate 8 and the temperature of the second site of the substrate 8 are respectively adjusted to the first temperature and the second temperature during the first processes and the second processes. For example, each of the squares R composing a central portion of the substrate 8 may be adjusted to the first temperature, and each of the squares R composing a peripheral portion of the substrate 8 may be adjusted to the second temperature. The first temperature in the present embodiment is a temperature of 10° C. or more (e.g., 60° C. or more), for example, and the second temperature in the present embodiment is a temperature of less than 10° C., for example.

The controller 23 controls various operations of the semiconductor manufacturing apparatus. For example, the controller 23 controls an operation of the plasma processor 21, an operation of the temperature adjuster 22, and data reading from the storage 24. Examples of the controller 23 include a processor, an electric circuit, and a PC (personal computer).

The controller 23 controls the plasma processor 21 such that a plurality of first processes of processing a portion of the switching layer 11 with plasma of first gas and a plurality of second processes of removing the portion of the switching layer 11 with plasma of second gas are alternately performed.

Accordingly, a thickness of the switching layer 11 on the substrate 8 is reduced.

The controller 23 further reads out the data of the positions of the first and second sites stored in the storage 24. The data is hereinafter referred to as "position data". The controller 23 causes the temperature adjuster 22 to control the temperature of the first site of the substrate 8 to the first temperature and control the temperature of the second site of the substrate 8 to the second temperature during the first processes and the second processes based on the position data read out. Accordingly, the first processes and the second processes can be performed while the temperature of the substrate 8 is controlled for each site.

When the first processes and the second processes are performed for the switching layer 11 on the substrate 8, as described above, the position data stored in the storage 24 are used. The substrate 8 is hereinafter referred to as a "first substrate 8".

The position data is previously generated based on a second substrate 8 different from the first substrate 8, and is stored in the storage 24. The second substrate 8 is a substrate to be subjected to steps illustrated in FIG. 4A to FIG. 6C, like the first substrate 8. A material and a size of the second substrate 8 are the same as a material and a size of the first substrate 8.

More specifically, the position data is generated in the following manner. First, a switching layer 11 or the like is formed on the second substrate 8, and first processes and second processes are performed for the switching layer 11 on the second substrate 8. The first processes and the second processes are performed in the semiconductor manufacturing apparatus of the present embodiment. Then, sizes (e.g., thicknesses) of plural sites of the second substrate 8 are measured, and positions of first and second sites are determined based on a difference between the measured sizes and their designed values. The positions of the first and second sites thus determined are stored as position data in the storage 24. In the foregoing processing for the second substrate 8, a temperature of the second substrate 8 is not adjusted for each site but the entire second substrate 8 is adjusted to the same temperature.

The sizes of the plural sites of the second substrate 8 may be measured at any of the sites and in any of the steps. For example, the thickness of the switching layer 11 formed on an upper face or a side face of the above-described stacked body may be measured at the various sites of the second substrate 8. The size is measured by SEM (scanning electron microscope) observation. In the present embodiment, sizes of layers other than the switching layer 11 may be measured, or sizes other than the thickness may be measured.

The first and second sites are determined in the following manner. First, the sizes of the sites are compared with a predetermined size. More specifically, a difference obtained by subtracting the predetermined size from the size of each site is calculated. An example of the predetermined size is a designed value of the size. If the size of each site is the thickness of the switching layer 11, for example, an example of the predetermined size is a designed value of the thickness of the switching layer 11. Data of the designed value is stored in the storage 24, for example.

The site having the size that differs from the predetermined size by a threshold value or more (i.e., the site having the size that greatly differs from the designed value) is determined as the first site, and the site having the size that differs from the predetermined size by less than the threshold value (i.e., the site having the size that slightly differs from the designed value) is determined as the second site. An example of the threshold value is an allowable value of an error. If a difference between a thickness of the switching layer 11 on a stacked body and its design value is the threshold value or more, a square R in the second substrate 8 positioned below the stacked body becomes a first site. On the other hand, if the difference between the thickness of the switching layer 11 on the stacked body and the designed value is less than the threshold value, the square R in the second substrate 8 positioned below the stacked body becomes a second site. In this manner, the first and second sites are determined based on the sizes.

As described above, the temperature of the first substrate 8 is adjusted using a processing result in the second substrate 8. More specifically, a site where a dimensional error is large on the second substrate 8 becomes a first site, and a site where a dimensional error is small on the second substrate 8 becomes a second site. When the first processes and the second processes are performed for the switching layer 11 on the first substrate 8, a temperature of the first site of the first substrate 8 is adjusted to a high temperature, and a temperature of the second site of the second substrate 8 is adjusted to a low temperature. Accordingly, the switching layer 11 on the first site is more easily removed than the switching layer 11 on the second site.

For processing in the first substrate 8, an error may occur, like the dimensional error in the second substrate 8 unless the temperature adjustment is thus performed based on the processing result in the second substrate 8. The reason is that a material and a size of the second substrate 8 are the same as a material and a size of the first substrate 8. That is, unless the temperature adjustment is performed, a dimensional error on the first site may increase and a dimensional error on the second site may decrease. However, in the present embodiment, the first site of the first substrate 8 is adjusted to have a high temperature. Therefore, the switching layer 11 on the first site is easily removed. Accordingly, the dimensional error on the first site can be decreased. As a result, according to the present embodiment, the dimensional error on the first site and the dimensional error on the second site can be decreased, so that the thickness of the switching layer 11 can be more favorably adjusted.

In the present embodiment, the number of cycles of the first and second processes on the switching layer 11 on the first substrate 8 may be determined based on the magnitude of the dimensional error in the second substrate 8. For example, the larger an average value of the dimensional error is, the larger the number of cycles may be made.

Although the semiconductor manufacturing apparatus of the present embodiment performs the temperature adjustment of the first substrate 8 using the processing result in the second substrate 8, a modification in which the temperature adjustment of the first substrate 8 is performed using a processing result in the first substrate 8 is also considered. According to the modification, the need for the processing result in the second substrate 8 can be eliminated. An example of the modification will be described below.

First, cycle etching of the first substrate 8 is performed using the method of the first embodiment, to measure sizes of plural sites of the first substrate 8. The cycle etching means alternately performing the first processes and the second processes, as described above. Among the sites, the site where an etching amount is insufficient is specified based on the measured sizes. Further, cycle etching of the first substrate 8 is additionally and selectively performed using the method of the first embodiment. In the case of the additional etching, the temperature control of the second embodiment is implemented. Accordingly, a shape in the site where the etching amount is insufficient can be corrected.

In this example, the shape of the site where the etching amount is insufficient can be corrected, but the shape of the site where the etching amount is excessive cannot be corrected. This example may be corrected, as described below.

First, cycle etching of the first substrate 8 is performed using the method of the first embodiment, to measure sizes of the plural sites of the first substrate 8. In this case, a cycle etching condition is set such that an etching amount becomes smaller than a target etching amount on the entire first substrate 8. Among the sites, the site where the etching amount is insufficient is specified based on the measured sizes. Since the cycle etching condition is set, as described above, a specific result that the site where the etching amount is insufficient exists but the site where the etching amount is excessive does not exist is obtained. Then, cycle etching of the first substrate 8 is additionally and selectively performed using the method of the first embodiment. In the case of the additional etching, the temperature control of the second embodiment is implemented. Accordingly, a shape of the site where the etching amount is insufficient can be corrected, and a shape of the entire surface of the first substrate 8 can be favorably corrected. More specifically, the etching amount can be controlled to a target etching amount on the entire surface of the first substrate 8.

While certain embodiments have been described, these embodiments have been presented by way of example only, and are not intended to limit the scope of the inventions. Indeed, the novel methods and apparatuses described herein may be embodied in a variety of other forms; furthermore, various omissions, substitutions and changes in the form of the methods and apparatuses described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
   forming a first film on a first substrate; and
   performing a first process of processing a portion of the first film with plasma of first gas to form an organic film on a surface of the first film and a second process of removing the portion of the first film and the organic film with plasma of second gas after the first process, wherein
   the first process is performed to alter the portion of the first film with the plasma of the first gas, and
   the second process is performed to ash the portion of the first film with the plasma of the second gas.

2. The method of claim 1, further comprising:
   alternately forming a plurality of second films and a plurality of third films on the first substrate,
   forming a first concave portion in the second and third films, and
   forming second concave portions on side faces of the third films in the first concave portion,
   wherein
   the first film is formed in the second concave portions by forming the first film on side faces of the second films and the side faces of the third films in the first concave portion, and
   the first film outside the second concave portions is removed by performing the first and second processes.

3. The method of claim 1, wherein the first gas includes at least $C_Y H_A F_Z$ gas where Y is an integer of one or more, A is an integer of zero or more, Z is an integer of one or more, a relationship of $Z \leq 2Y$ is satisfied, C represents carbon, H represents hydrogen, and F represents fluorine.

4. The method of claim 1, wherein the second gas includes at least $O_2$ gas, CO gas, $CO_2$ gas, COS gas, $H_2O$ gas, $H_2$ gas, $N_2O$ gas, or $N_2$ gas where O represents oxygen, C represents carbon, S represents sulfur, H represents hydrogen, and N represents nitrogen.

5. The method of claim 1, wherein ion energy of the plasma of the first gas and ion energy of the plasma of the second gas are less than 100 eV.

6. The method of claim 1, wherein the first film contains W (tungsten), Al (aluminum), Ti (titanium), Ta (tantalum), Fe (iron), Pt (platinum), Mg (magnesium), Si (silicon), Mo (molybdenum), Co (cobalt), La (lanthanum), Hf (hafnium), Ir (iridium), Ru (ruthenium), Zr (zirconium), or Re (rhenium).

7. The method of claim 1, wherein the first film is a single metal film, a metal oxide film or a metal nitride film.

8. The method of claim 1, wherein comprising alternately performing a plurality of first processes of processing the portion of the first film with the plasma of the first gas to form the organic film on a surface of the first film and a plurality of second processes of removing the portion of the first film and the organic film with the plasma of the second gas, to reduce a thickness of the first film.

9. The method of claim 1, further comprising controlling a temperature of a first site of the first substrate to a first temperature and controlling a temperature of a second site of the first substrate to a second temperature lower than the first temperature during the first and second processes.

10. The method of claim 9, further comprising:
    forming the first film on a second substrate that is different from the first substrate,
    performing the first and second processes of the first film on the second substrate, and measuring sizes of plural sites of the second substrate and determining positions of the first and second sites based on the measured sizes, wherein the temperature of the first site of the first substrate is controlled to the first temperature and the temperature of the second site of the first substrate is controlled to the second temperature, based on the positions of the first and second sites determined based on the measured sizes, when the first and second processes are alternately performed for the first film on the first substrate.

11. The method of claim 9, further comprising:

measuring sizes of plural sites of the first substrate and determining positions of the first and second sites based on the measured sizes, wherein the temperature of the first site of the first substrate is controlled to the first temperature and the temperature of the second site of the first substrate is controlled to the second temperature, based on the positions of the first and second sites determined based on the measured sizes, when the first and second processes are performed for the first film on the first substrate.

12. The method of claim 10, further comprising:

determining, as the first site, a lower portion of a site having a size that differs from a predetermined size by more than a threshold value, and determining, as the second site, a lower portion of a site having a size that differs from the predetermined size by less than the threshold value.

13. The method of claim 9, wherein the first temperature is 10° C. or more, and the second temperature is less than 10° C.

* * * * *